United States Patent [19]

Mahl

[11] 4,205,623

[45] Jun. 3, 1980

[54] VACUUM DEPOSITION APPARATUS

[75] Inventor: Gunard O. B. Mahl, San Francisco, Calif.

[73] Assignee: CHA Industries, Menlo Park, Calif.

[21] Appl. No.: 905,406

[22] Filed: May 15, 1978

[51] Int. Cl.² .................................................. C23C 13/08
[52] U.S. Cl. ................................................................ 118/715
[58] Field of Search .................. 118/49, 49.1, 50, 715; 34/92, 242

[56] References Cited

U.S. PATENT DOCUMENTS

| 3,238,918 | 3/1966 | Radke et al. | 118/49.1 |
| 3,368,523 | 2/1968 | Becker | 118/49 |
| 3,643,625 | 2/1972 | Mahl | 118/48 |
| 3,892,198 | 7/1975 | Dobson | 118/49 |

Primary Examiner—Won H. Louie, Jr.
Attorney, Agent, or Firm—Phillips, Moore, Weissenberger, Lempio & Majestic

[57] ABSTRACT

A thin-film deposition apparatus comprises a cabinet having a vessel mounted therein which defines a vacuum chamber adapted to retain processed articles. A vacuum unit is mounted in the cabinet to communicate with an opening defined in the vacuum chamber whereby the chamber may be evacuated upon actuation of the pump of the vacuum unit. A door is movably mounted on a front panel of the cabinet for movement between closed and opened positions and a fan is preferably mounted on the cabinet and above the door to blow a laminar airflow over the front panel of the cabinet.

12 Claims, 4 Drawing Figures

VACUUM DEPOSITION APPARATUS

BACKGROUND OF THE INVENTION

This invention relates to a vacuum deposition apparatus of the type adapted to deposit a thin-film of material over articles or substrates retained in a vacuum chamber of the apparatus.

Apparatus of this type normally comprise a plurality of racks mounted in the vacuum chamber of the apparatus for retaining the articles, such as silicon wafers, thereon during processing. U.S. Pat. No. 3,643,625, for example, discloses such an apparatus wherein a vertically oriented vacuum chamber is defined within a glass bell jar mounted on a stationary support. Such an apparatus has proved somewhat cumbersome to use, particularly in regards to the loading of articles within the vacuum chamber and the subsequent removal thereof. In addition, conventional apparatus do not provide means for protecting the articles against exposure to contaminants, such as dust, during the loading and removal thereof.

SUMMARY OF THIS INVENTION

An object of this invention is to overcome the above, briefly described problems by providing a fully integrated and compact vacuum deposition apparatus whereby articles may be processed expeditiously and efficiently without unduly subjecting them to contaminants, such as dust.

The apparatus of this invention comprises an upstanding, front-loading cabinet having a vessel mounted therein which defines a vacuum chamber adapted to retain processed articles. A vacuumizing means is also mounted in the cabinet to communicate with an opening to the vacuum chamber to selectively draw a vacuum therein. A door means is movably mounted on a vertically disposed front panel of the cabinet for movement between a closed position, closing an inlet to the vacuum chamber, and an opened position whereby the inlet is fully exposed.

In the preferred embodiment of this invention, an air distributing means is adapted to blow a laminar airflow across the front panel of the cabinet and across the inlet to the vacuum chamber. The air functions to maintain processed articles in a substantially dust-free condition both upon loading of the articles in the vacuum chamber and removal of the processed articles therefrom.

BRIEF DESCRIPTION OF THE DRAWINGS

Other objects of this invention will become apparent from the following description and accompanying drawings wherein.

DETAILED DESCRIPTION

Figure 1:
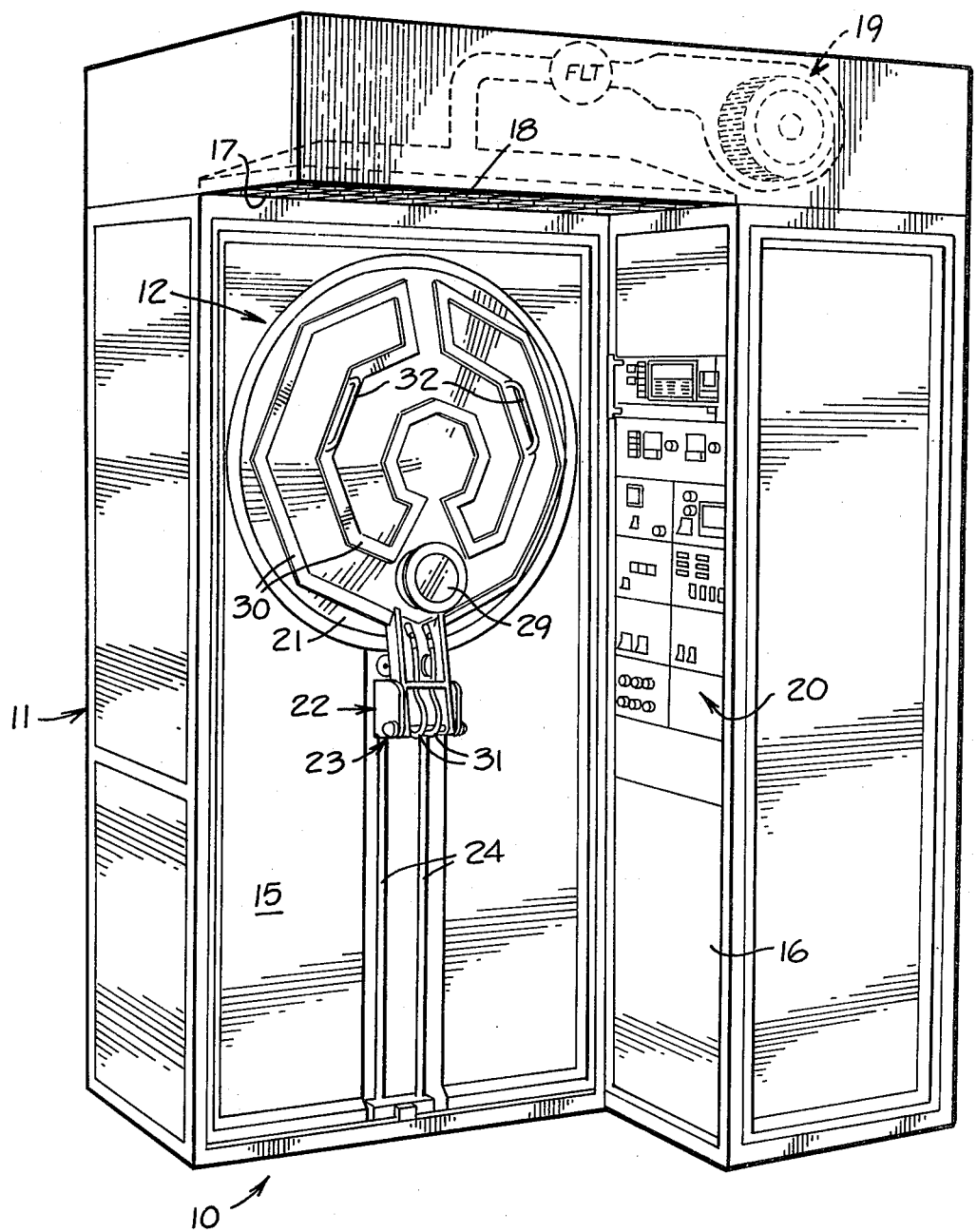
FIG. 1 is a front perspective view of a vacuum deposition apparatus embodying this invention.

FIG. 1 illustrates a vacuum deposition apparatus 10 comprising an upstanding cabinet 11 having a door assembly 12 movably mounted thereon to normally close an inlet to a vacuum chamber defined in the cabinet and hereinafter fully described. As disclosed in U.S. Pat. No. 3,643,625, articles, such as silicon wafers, are adapted to be mounted on racks placed in the vacuum chamber and thereafter coated with a thin-film of vaporized material, such as metal. Upon completion of the coating process, the door means is opened and the processed articles are removed whereby the operation may be repeated.

Figure 2:
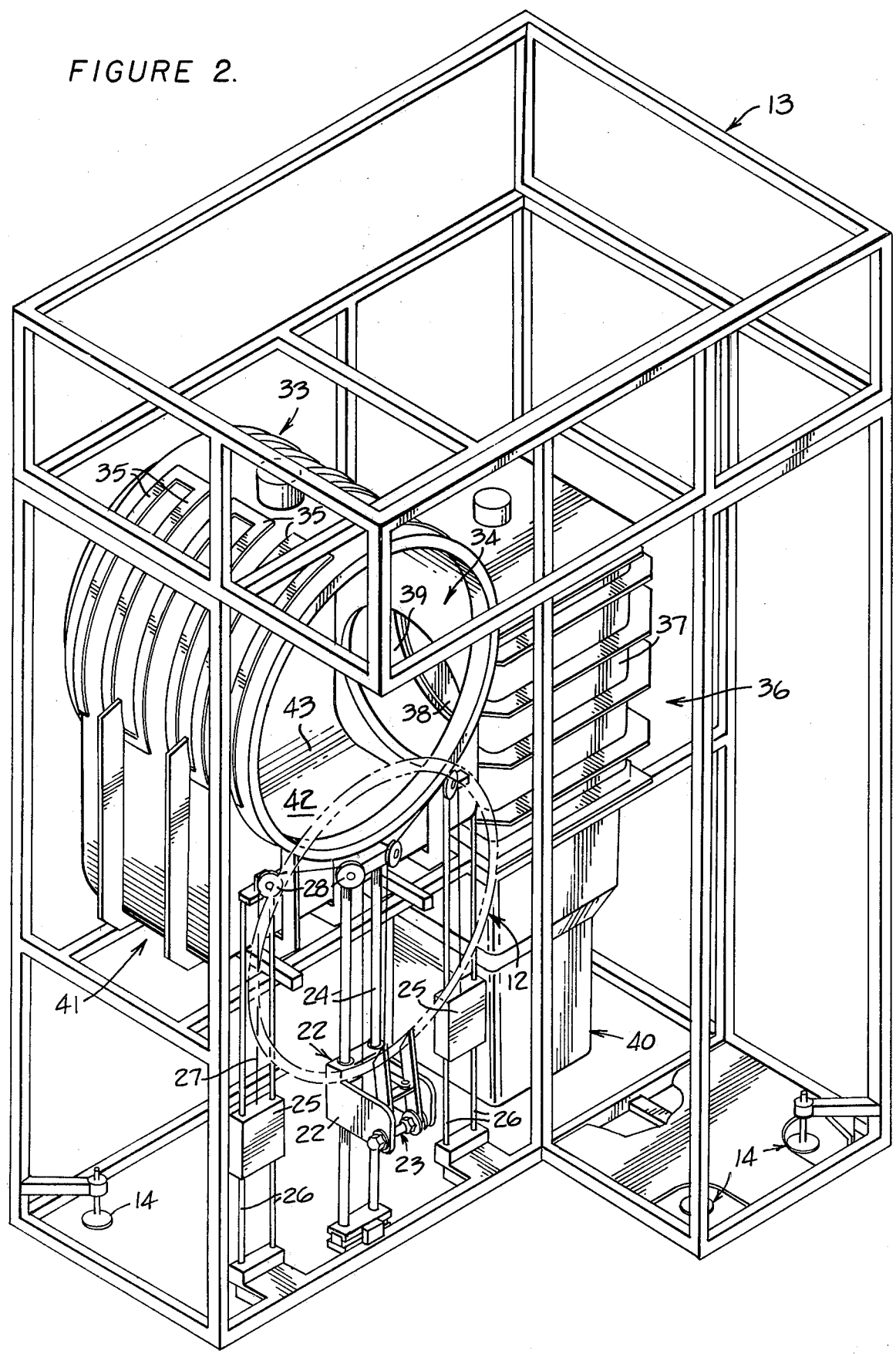
FIG. 2 is an isometric view of the apparatus, but with panels thereof removed to disclose the interior thereof.

Referring to FIGS. 1 and 2, cabinet 11 comprises an integrated frame structure 13 having levelling casters 14 attached on the base thereof to dispose the cabinet in a level condition and to afford mobility thereto. The panels comprise a vertically disposed front panel 15 and a vertically disposed side panel 16, adjoined to the front panel and disposed in perpendicular relationship therewith. The upper end of the cabinet comprises a horizontally disposed upper panel 17, preferably in the form of a plastic grid, overlying door assembly 12 and having a plurality of openings 18 formed therethrough.

A standard electically driven fan means 19, preferably a squirrel cage fan, is mounted in a closed compartment of the cabinet, partially defined by upper panel 17, to communicate with openings 18 via suitably arranged conduits and an air filter to provide air distributing means for blowing a laminar airflow across the front panel of the cabinet for purposes hereinafter explained. Panels 15–17 are adjoined to at least partially confine and guide air egressing from openings 18 in a laminar and non-turbulent manner. The fan means, as well as the other operating mechanisms of the apparatus, may be selectively actuated by an operator control means or control panel 20, conveniently mounted for operator access on side panel 16.

Door assembly 12 is fully described in U.S. patent application Ser. No. 960,025, filed on May 15, 1978, by Gunard O. B. Mahl for "Vacuum Chamber Door Assembly And Method". In general, the door assembly comprises a door means 21 pivotally mounted on a bracket assembly 22 by adjustable pivot means 23. Such pivot means insures a positive seal as between a gasket (not shown) secured on the door means and the cabinet when the door means is maintained in its raised and closed position illustrated in FIG. 1.

Figure 3:
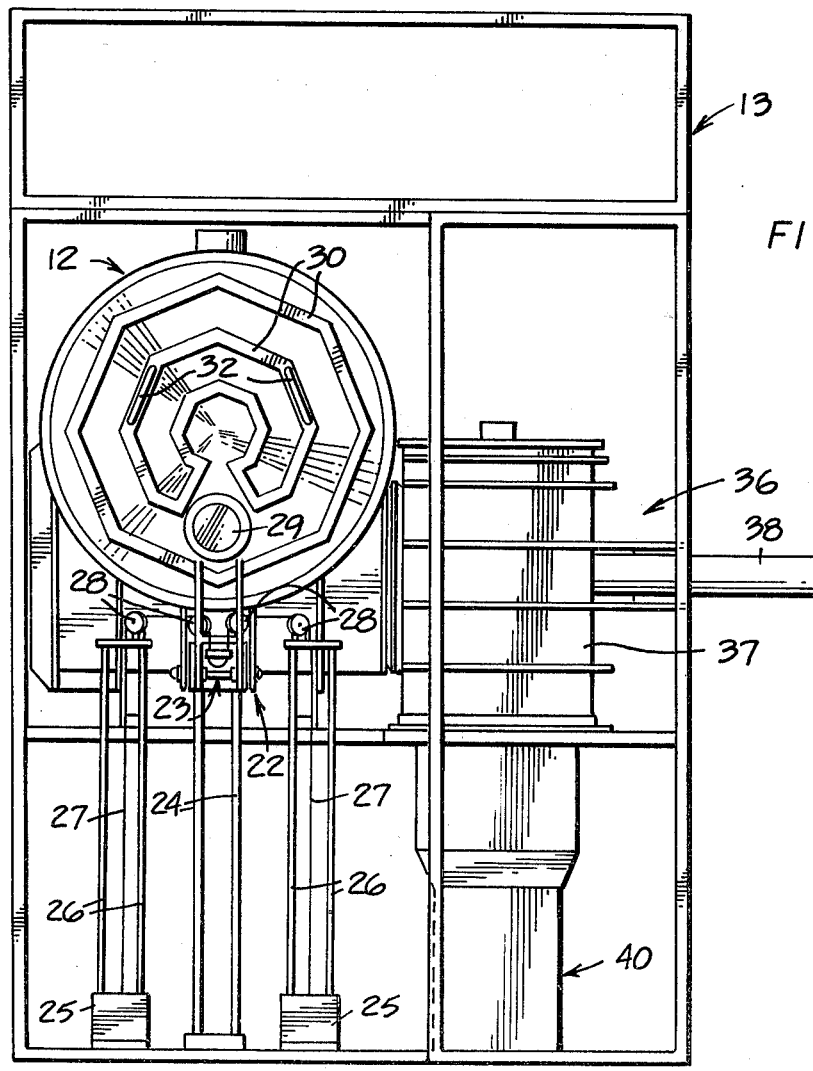
FIG. 3 is a reduced front elevational view of the apparatus, also having the panels thereof removed for clarification purposes.

Bracket assembly 22 is reciprocally mounted on a pair of vertically disposed rods 24 whereby the door may be pivoted rearwardly and lowered to a remote position for operator access to the vacuum chamber defined in the cabinet. As shown in FIGS. 2 and 3, a pair of counterweights 25 are each mounted for reciprocal movements on a pair of vertically disposed rods 26 to counterbalance bracket assembly 22 and door means 21 to aid in the manipulation of the door means by the operator. Each counterweight is secured to a flexible common cable 27 entrained over a pair of pulleys 28, the cable being further secured to bracket assembly 22.

Referring again to FIG. 1, a window 29 is mounted on door means 21 to provide the operator with visual inspection of the articles being processed within cabinet 11. One or more mirrors (not shown) may be suitably mounted in the cabinet to aid in such visual inspection of the articles. A plurality of intercommunicating channels 30 are formed on the door means to have a coolant, such as tap water, circulated therethrough by means of inlet and outlet lines 31. A pair of handles 32 are secured on the channels to maintain them in a cooled condition whereby they may be grasped by the hands of the operator for opening and closing the door means.

Figure 4:
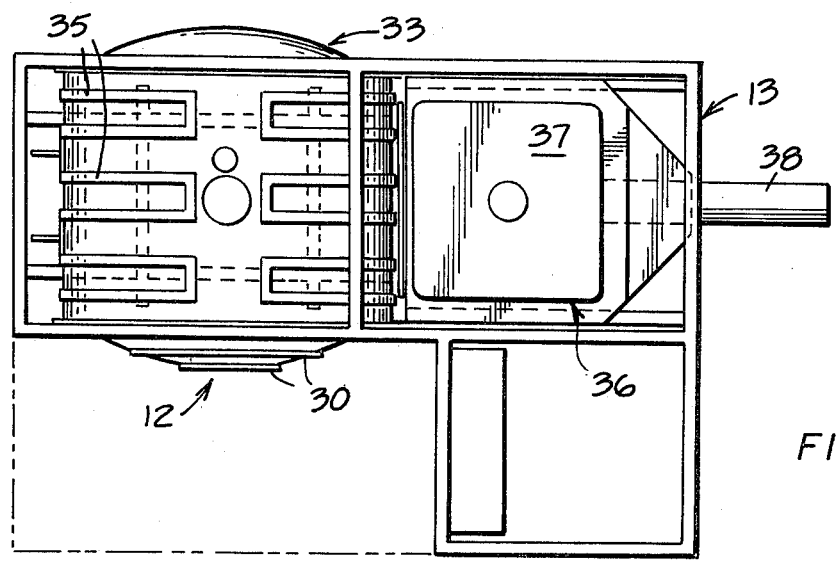
FIG. 4 is a top plan view of the apparatus.

Referring to FIGS. 2–4, a generally cylindrical vessel 33 is mounted on frame 13 of the cabinet and defines a vacuum chamber 34 therein, having its longitudinal axis disposed horizontally. As suggested above, articles to be processed are adapted to be mounted on racks (not shown) positioned in the vacuum chamber. A plurality of intercommunicating and longitudinally spaced channels 35 substantially circumvent vessel 33 and are connected to a pressurized coolant source to selectively circulate a coolant, such as tap water, therethrough.

A vacuumizing means 36 comprises an upstanding housing 37 securely mounted on frame 13 of the cabinet and disposed adjacent to a side of vessel 33. The housing has a gate valve 38 in the form of a piston reciprocally mounted therein to normally close an annular opening 39, formed through a side of the vessel, to communicate vacuum chamber 34 with the vacuumizing means. Reciprocation of the piston, between its illustrated closed and opened positions, may be pneumatically or electrically controlled in a conventional manner.

The vacuumizing means further comprises standard pumps such as mechanical pumps, diffusion pumps, cryogenic pumps, ion pumps or the like (not shown) mounted in a lower pumping section 40 of housing 37 whereby a vacuum may be selectively drawn in vacuum chamber 34 upon exposure of opening 39 by rightward movement of piston 38 in FIGS. 3 and 4. Interior wall portions of the housing which are cooled by liquid nitrogen function as a cryogenic pump to aid in the creation of a high vacuum. It should be noted that opening 39 is disposed on a side of vessel 33 and that pumping section 40 of the vacuumizing means is disposed transversely relative to the opening and not in line therewith. This arrangement facilitates the utilization of a large capacity high speed pump to quickly induce a substantially low pressure or vacuum in vacuum chamber 34.

A standard evaporation source means (not shown) may be mounted in vessel 33 for selectively evaporating material placed therein for deposition on the articles retained in the vacuum chamber. Such a source means may be of the type described in U.S. Pat. No. 3,970,820. In addition, conventional heating means (not shown) may be suitably mounted in the vacuum chamber to bake-out the articles and chamber prior to the application of a thin coat of material thereto by the evaporation source means. As further shown in FIG. 2, a bottom portion 41 of vessel 33 defines a horizontally disposed and generally flat bottom 42 in vacuum chamber 34.

In operation, the operator may open door means 21 by grasping handles 32 (FIG. 1) to pivot the door rearwardly and away from cabinet 11. The door may be lowered along rods 24 to a position remote from vacuum chamber 34 to fully expose the inlet thereto. The operator may then place the articles to be processed, such as silicon wafers, in the vacuum chamber and the door may be raised and pivoted forwardly to its closed and sealed position illustrated in FIG. 1.

The appropriate controls on the control panel 20 are manipulated to draw a vacuum in vacuum chamber 34 upon activation of the pumps retained in pumping section 40 of the vacuumizing means. As described above, gate valve 38 would then be actuated to withdraw it to a retracted position to expose the vacuum chamber to the pump means via opening 39. Then, the above-mentioned heating means may be activated to bake-out the wafers prior to final processing.

The evaporation source means (not shown) is then actuated to disperse evaporated material, such as metal, within the vacuum chamber whereby the articles retained therein are coated with the material. Upon completion of the deposition process, the gate valve is again closed, and the vacuum chamber is suitably vented to ambient.

Upon opening of door means 21 to remove the completed articles, it should be noted that the laminar airflow emanating from openings 18 will maintain the articles in a substantially dust-free condition. Likewise, when the articles are being loaded into the vacuum chamber, they are also maintained in a dust-free condition due to the constant blowing of filtered ambient air thereover. As described above, panels 15–17 substantially confine the airflow to aid in such desiderata. It should be further noted that control panel 20 is mounted closely adjacent to door means 21 whereby the operator may remain in close proximity to the vacuum chamber and to window 29 during the processing operation.

From the above description it can be seen that the apparatus of this invention exhibits desiderata nowhere found in the prior art. For example, the apparatus is designed for operator safety and convenience, simplifies installation and maintenance, substantially eliminates contamination of the processed articles and is highly reliable and efficient in operation.

I claim:

1. A vacuum deposition apparatus comprising
   an upstanding cabinet,
   a vessel mounted in said cabinet and defining a vacuum chamber adapted to retain articles for processing therein,
   a vacuumizing means mounted in said cabinet and communicating with an opening to said vacuum chamber for selectively drawing a vacuum therein,
   door means movably mounted on a vertically disposed front panel of said cabinet for movement between a closed position closing an inlet to said vacuum chamber and an opened position fully exposing said inlet, and
   air distributing means mounted on said cabinet, vertically above and in overlying relationship relative to said door means, for blowing a laminar airflow across the front panel of said cabinet and said inlet.

2. The apparatus of claim 1 wherein said air distributing means comprises a fan mounted in a closed compartment defined on an upper end of said cabinet and a plurality of openings formed through a horizontally disposed upper panel partially defining said compartment, said upper panel adjoined to said front panel and overlying said door means.

3. The apparatus of claim 2 wherein said cabinet further comprises a vertically disposed side panel adjoined to said upper panel and to said front panel to guide air egressing from said openings therebetween.

4. The apparatus of claim 3 further comprising operator control means mounted on said side panel adapted to control actuation of said vacuumizing means.

5. The apparatus of claim 1 further comprising a plurality of cooling channels formed on said vessel and adapted to have a coolant communicated therethrough.

6. The apparatus of claim 5 wherein said cooling channels at least substantially circumvent said vessel and are spaced longitudinally thereon.

7. The apparatus of claim 1 wherein said vacuumizing means comprises an upstanding housing secured in said cabinet and disposed on a side of said vessel.

8. The apparatus of claim 7 wherein said vacuumizing means further comprises a pumping section mounted on a lower end of said housing and disposed transversely relative to the opening to said vacuum chamber.

9. The apparatus of claim 1 wherein said door means is pivotally mounted on said cabinet for movement towards and away from said cabinet between its closed and opened positions, respectively.

10. The apparatus of claim 9 further comprising a bracket having said door means pivotally mounted thereon and means for reciprocally mounting said bracket assembly for vertical movements on said cabinet from a raised position adjacent to said vacuum chamber and a lowered position remote from said vacuum chamber.

11. The apparatus of claim 1 wherein said vessel is generally cylindrical and has its longitudinal axis disposed horizontally.

12. The apparatus of claim 11 wherein said vessel further comprises a bottom portion defining a horizontally disposed and generally flat bottom in said vacuum chamber.

* * * * *